United States Patent [19]
Bajuk et al.

[11] Patent Number: 5,484,672
[45] Date of Patent: Jan. 16, 1996

[54] METHOD OF MAKING A RIM-TYPE PHASE-SHIFT MASK

[75] Inventors: Stanislav P. Bajuk, Madison, Wis.; David S. O'Grady, Jericho, Vt.; Edward T. Smith, Somerville, Mass.

[73] Assignee: International Business Machines Corporation, Armonk, N.Y.

[21] Appl. No.: 378,767

[22] Filed: Jan. 25, 1995

Related U.S. Application Data

[63] Continuation of Ser. No. 975,766, Nov. 13, 1992, abandoned.

[51] Int. Cl.$^6$ .................................................. G03F 9/00
[52] U.S. Cl. ................................ 430/5; 430/312; 430/313
[58] Field of Search ................................ 430/5, 22, 269, 430/311, 312, 313, 321, 396

[56] References Cited

U.S. PATENT DOCUMENTS

| | | | |
|---|---|---|---|
| 3,676,002 | 7/1972 | Moreau et al. | 355/133 |
| 4,895,790 | 1/1990 | Swanson et al. | 430/321 |
| 4,948,706 | 8/1990 | Sugihara et al. | 430/312 |
| 5,045,417 | 9/1991 | Okamoto | 430/5 |

FOREIGN PATENT DOCUMENTS

| | | | |
|---|---|---|---|
| 0477035A3 | 3/1992 | European Pat. Off. | G03F 1/14 |
| 2297093 | 8/1976 | France | B05D 1/38 |
| 4073758 | 3/1992 | Japan | G03F 1/08 |
| 3401963A1 | 7/1985 | Switzerland | G03F 7/00 |

OTHER PUBLICATIONS

Nitayama et al., "New Phase Shifting Mask with Self–aligned Phase Shifters for a Quarter Micron Photolithography," IEDM IEEE 1989, pp. 3.3.1–3.3.4.

Todokoro et al., "Self–Aligned Phase Shifting Mask for Contact Hole Fabrication," Microelectronic Engineering, 1991, pp. 131–134, No. 13.

Ishiwata et al., "Fabrication of Phase–Shifting Mask," Proceedings of the SPIE, vol. 1463, pp. 423–433, 1991.

"Self–Aligned Phase Shifting Mask for Contact Hole Fabrication," Y. Tokokoro et al., Microelectronic Engineering, Mar. 1991, No. 1/4, pp. 131–134.

Primary Examiner—S. Rosasco
Attorney, Agent, or Firm—Lawrence H. Meier

[57] ABSTRACT

A method of forming rim type phase-shift lithography mask (140) involving backside overexposure of a positive resist layer (130) overlying a patterned light-blocking layer (120). By subjecting the resist layer to electromagnetic radiation (132) (e.g., broad band UV) transmitted via the backside (115) of the mask substrate (112), portions (134) of the resist layer extending from peripheral edges of the light blocking layer inwardly a selected distance are activated. After developing activated portions of the resist layer, the "pull back" of the resist layer is transferred to the underlying light blocking layer by anisotropically etching portions of the light blocking layer not covered by the resist layer, thereby forming the desired rim structure.

16 Claims, 3 Drawing Sheets

METHOD OF MAKING A RIM-TYPE PHASE-SHIFT MASK

This is a continuation of application Ser. No. 07/975,766 filed on Nov. 13, 1992, now abandoned.

FIELD OF THE INVENTION

The present invention relates to phase-shift lithography and, more particularly, to methods of forming rim-type phase-shift lithography masks.

BACKGROUND OF THE INVENTION

Optical photolithography has been widely used in the semiconductor industry in connection with the formation of a wide range of structures in integrated circuit (IC) chips. As the device density on IC chips has increased, the size of the structures making up the devices has approached the wave length (around 0.5 μm) of the light used in optical photolithography processes. This correspondence in size of the structure and wave length of the incident light, together with defraction, interference and/or light divergence phenomenon, can adversely affect the resolution of optical photolithography to an extent that future density increases in IC devices may be difficult to achieve absent the development of alternative lithographic technologies.

In part as a result of these limitations of optical photolithography, X-ray lithography was developed. Due to the shorter wave length of the soft X-rays used in X-ray lithography, generally about 0.1 to 1.0 nanometers, resolution is improved significantly. With increased resolution it becomes possible to increase the device density on IC chips and/or increase chip yield. X-ray lithography has yet to be widely adopted by the semiconductor industry due, in part, to the relatively high cost of the synchrotron and other equipment used in X-ray lithography.

Phase-shift lithography was developed to enhance the range of conventional optical photolithography. Phase-shift lithography is based on opposite phase destructive interference of the waves of incident light. By shifting the phase of one region of incident light waves 180° relative to an adjacent region of incident light waves, a sharply defined dark zone is created beneath the phase-shift mask due to destructive interference of the waves. This zone defines the interface between light and dark regions, and hence defines the boundary between exposed and unexposed portions of the resist layer underlying the phase-shift mask.

Several different phase-shift lithography techniques have been developed. One of the earliest techniques developed, as reported by Levenson et al. in the article "Improved Resolution in Photolithography with a Phase Shifting Mask," *IEEE Transactions on Electron Devices*, Vol. ED-29, Nov. 12, December, 1982, pages 18–36, involves the use of a periodic pattern arrangement in the transmission mask. Although the Levenson technique provides very sharp image contrast, it tends to be relatively difficult to fabricate phase shift masks for the technique. Such fabrication difficulties arise from the requirement that mask openings be arranged in a periodic fashion that typically does not conform exactly to the desired design layout needed for printing.

Another phase shift lithography technique was developed, in part, to avoid the relatively complex mask fabrication requirements of the Levenson technique. This alternative phase-shift lithography process, known as self-aligned phase-shift lithography or rim-type phase-shift lithography, has been reported by Todokoro et al. in the article "Self-aligned Phase Shifting Mask for Contact Hole Fabrication," *Microelectronic Engineering*, Nov. 13, 1991, pages 131–134, and by Ishiwata et al. in the article "Fabrication of Phase-Shifting Mask," *Proceedings of the SPIE*, Vol. 1463, pages 423–33, 1991.

Figure 1:
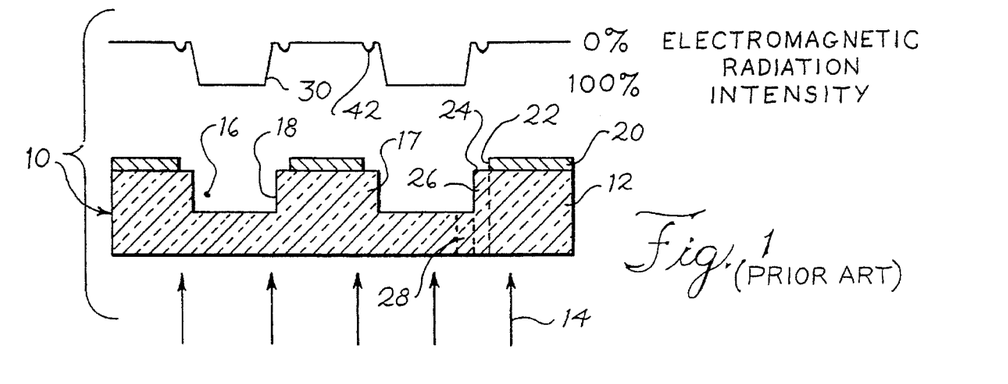
FIG. 1 is a cross-sectional view of a conventional rim-type phase-shift mask with a graphical representation of the intensity of light transmitted through the mask being provided above the mask.

As illustrated in FIG. 1, rim-type phase-shift lithography involves the use of a mask 10 comprising a substrate 12 made from a material through which incident electromagnetic radiation 14 used in the phase-shift lithography process will propagate. Substrate 12 has a plurality of recessed portions 16 separated by mesas 17. Sidewalls 18 define the boundary between recessed portions 16 and mesas 17. Portions of the top surfaces of mesas 17 are covered with a blocking layer 20, e.g., a layer of chromium, through which electromagnetic radiation 14 cannot be transmitted. Blocking layer 20 is formed so that edges 22 thereof are "pulled back" somewhat (i.e., are moved horizontally inwardly) relative to adjacent sidewalls 18, thereby exposing portions 24 of the top surface of substrate 12.

The height of sidewall 18, i.e., the distance between surface portion 24 and the base of recess 16, is selected so that electromagnetic radiation 14 impinging the back side of substrate 12 and propagating through portion 26 (FIG. 1) of substrate 12 exits surface portion 24 180° out of phase with electromagnetic radiation impinging the back side of the substrate and propagating through portion 28 (FIG. 1) of the substrate and exiting the bottom of recessed portion 16 adjacent sidewall 18. This phase shift occurs because substrate 12 modifies the phase of electromagnetic radiation transmitted therethrough an amount that varies as a function of the refractive index and the thickness of the substrate through which the electromagnetic radiation is transmitted. Thus, knowing the extent to which substrate 12 modifies the phase of electromagnetic radiation 14 transmitted therethrough, recessed portions 16 are formed to a depth sufficient to cause the 180° phase shift of electromagnetic radiation 14 described above. Due to destructive interference between electromagnetic radiation 14 transmitted through substrate portions 26 with radiation transmitted through substrate portions 28, a nearly vertical interface in the intensity of radiation transmitted through mask 10 is formed extending substantially along planar extensions of sidewalls 18. The graph above mask 10 in FIG. 1 illustrates the intensity of electromagnetic radiation 14 transmitted through mask 10, with nearly vertical lines 30 representing the sharp light/dark interface extending substantially along planar extensions of sidewalls 18.

Figures 2A, 2B:
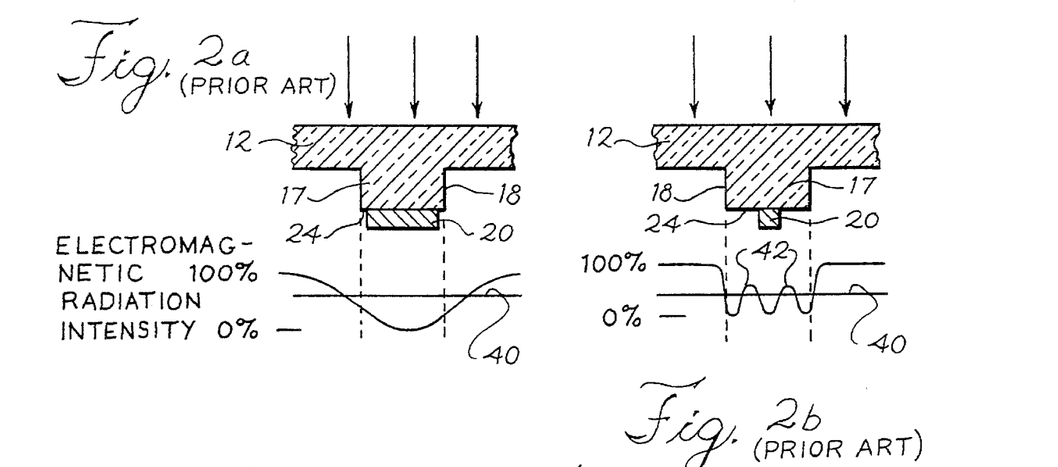
FIG. 2a is a cross-sectional view of a portion of a rim-type phase-shift mask in which the blocking layer is not pulled back a sufficient amount from the adjacent substrate sidewalls, with the intensity of light transmitted through such mask portion being illustrated beneath the mask portion.
FIG. 2b is similar to FIG. 2a, except that the blocking layer is pulled back too far relative to the adjacent substrate sidewalls, with the intensity of light transmitted through the mask portion being illustrated beneath such mask portion.

It is important that the extent to which blocking layer 20 is pulled back relative to sidewall 18 be precisely controlled. As illustrated in FIG. 2a, if sufficient pull back of blocking layer 20 is not achieved, and hence only a relatively small surface portion 24 is exposed, substantially no destructive interference of the transmitted radiation occurs. As such, the intensity of radiation intercepting underlying resist layer 40 drops off gradually relative to planar extensions of sidewalls 18. Consequently, the patterns activated on resist layer 40 are larger than is desired. By contrast, as illustrated in FIG. 2b, if blocking layer 20 is pulled back too much relative to sidewall 18, thereby creating relatively large surface portions 24, some of the radiation propagating through the mesa 17 will not destructively interfere with radiation transmitted through adjacent recessed portions 16. Consequently, two regions 42 (FIG. 2b) of relatively high intensity electromagnetic radiation will occur at resist layer 40. These high intensity regions 42 can result in the activation of portions of resist layer 40 that are not intended to be activated, with the result that undesired structure may be formed in the underlying wafer during subsequent process steps.

Figure 3A:
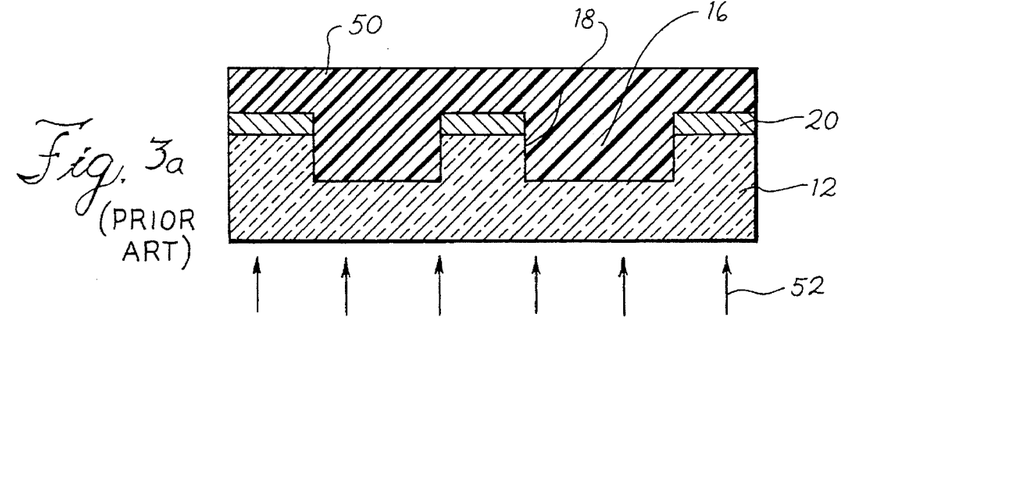
FIGS. 3a–3d illustrate the steps in a known process for forming a rim-type phase shift mask.

Unfortunately, implementation of rim-type phase-shift lithography has been limited due to the absence of processes for forming phase-shift masks that permit the extent of pull back of blocking layer 20 to be controlled to the extent required to avoid the above-described undesirable effects illustrated in FIG. 2a and 2b. For example, in processes for forming rim-type phase-shift masks of the type disclosed by Ishiwata et al., as referenced above, blocking layer 20 is pulled back relative to sidewalls 18 by horizontal etching, which process tends to be difficult to control. More specifically, referring to FIGS. 3a–3d, preliminary steps in the Ishiwata et al. process produce the structure illustrated in FIG. 3a. As described above in connection with the discussion of FIG. 1, the structure illustrated in FIG. 3a comprises a quartz substrate 12 in which a plurality of recessed portions 16 are formed, each defined by sidewalls 18. The top surface of substrate 12 is covered with a chromium blocking layer 20. The process step illustrated in FIG. 3a involves covering the recessed portion 16 and blocking layer 20 with a layer of positive resist 50. Then, the backside of substrate 12 is exposed to light, indicated by arrows 52, which propagates through quartz substrate 12 and into resist layer 50, except where transmission of such light into the resist layers is blocked by chromium layer 20.

Figure 3B:
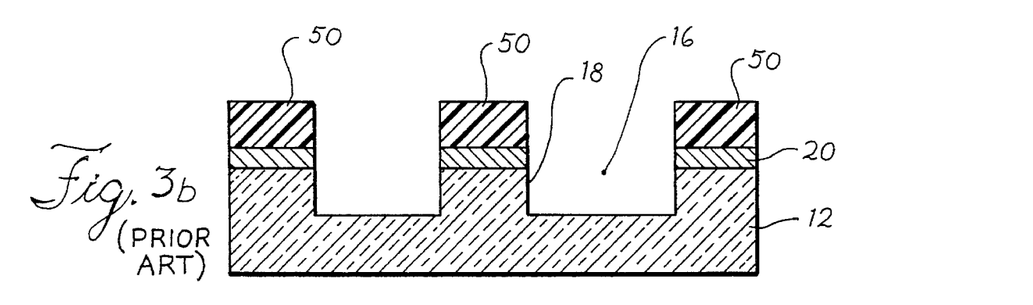

Next, portions of resist layer 50 activated by light 52 are developed and removed, as illustrated in FIG. 3b. As a result of this backside exposure and subsequent removal of activated portions of the resist layer, unactivated portions of the resist layer remain on top of chromium blocking layer 20. These unactivated portions have substantially vertical sidewalls that are substantially coplanar with the vertical sidewalls of chromium blocking layer 20 and sidewalls 18 of recessed portions 16.

Figure 3C:
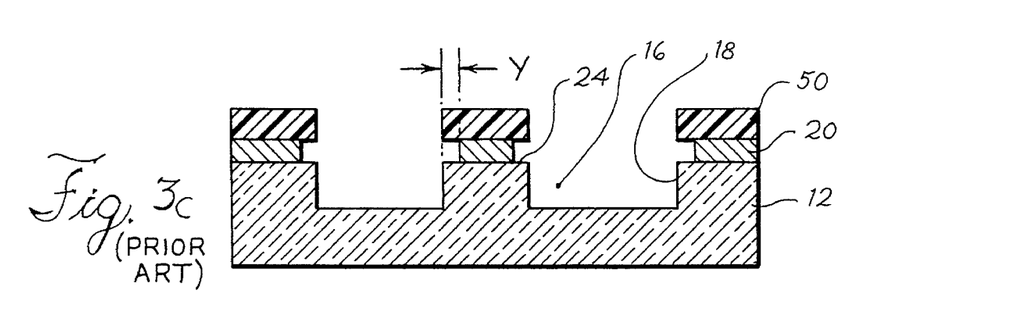

Referring to FIG. 3c, the mask is then subjected to an isotropic (non-directional) plasma etching process for a period of time sufficient to remove those portions of chromium blocking layer 20 adjacent the plane of sidewalls 18 so as to expose portions 24 of the top surface of substrate 12. Because blocking layer 20 is covered with resist layer 50, the blocking layer is etched almost exclusively in a horizontal direction. Hence, the process illustrated in FIGS. 3a–3d may be characterized as a horizontal etching process. The horizontal extent to which layer 20 is removed is indicated in FIGS. 3c and 3d as pull back distance "Y."

Figure 3D:
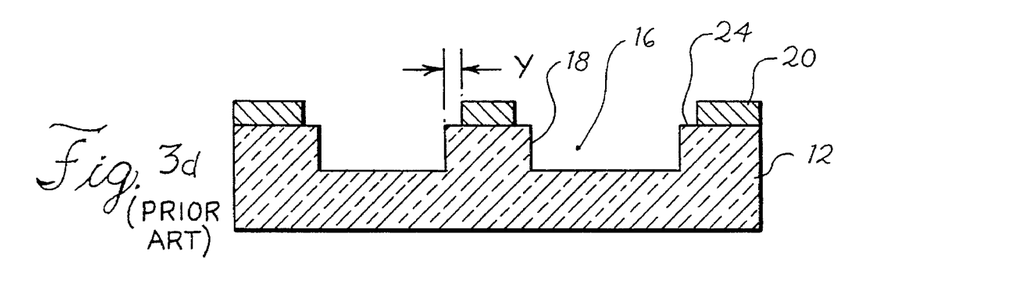

Finally, as illustrated in FIG. 3d, the remaining portions of resist layer 50 are removed.

With the Ishiwata et al. process described above, it tends to be difficult to control the extent of pull back of blocking layer 20 relative to sidewalls 18 because portions of layer 20 are removed substantially linearly with time until little or no blocking layer remains. Consequently, if the plasma etching of chrome blocking layer 20 is conducted for slightly more or less time than is required, the pull back distance Y of layer 20 can vary to an extent sufficient to result in the creation of a mask that produces the undesirable effects illustrated in FIGS. 2a and 2b and described above. Additionally, variations in distribution of the plasma of the etching process can also produce unacceptably large variations in the extent of pull back of chrome blocking layer 20 across a mask surface.

Therefore, a need exists for a method of forming a rim-type phase-shift mask of the type illustrated in FIGS. 1 and 3d that is sufficiently controllable such that only an acceptably small variation in the extent of pull back of blocking layer 20 occurs across a mask surface.

SUMMARY OF THE INVENTION

The present invention is a method of forming a rim-type phase-shift mask designed for use in a phase-shift lithography process. The method uses, as a starting material, a substrate having opposing first and second surfaces, with the first surface being covered with a first layer of material (e.g., Cr) that substantially blocks the transmission therethrough of electromagnetic radiation used in the phase-shift mask lithography process (e.g., radiation having a wavelength of 248 nm). The substrate is made from a material through which a predetermined frequency range of electromagnetic radiation may be transmitted.

As a first step in the method, a plurality of openings is formed in the first layer so as to expose portions of the first surface of the substrate.

Next, a layer of resist is deposited on the first layer.

Then, the second surface of the substrate is exposed to electromagnetic radiation having a frequency in the predetermined frequency range for a period of time sufficient to permit the electromagnetic radiation to propagate through the substrate and activate those portions of the layer of resist on the first layer extending from peripheral edges of the first layer inwardly a distance of at least about 0.05 micron. Such activation is believed to occur, at least in part, due to near-field diffraction effects.

Thereafter, those portions of the layer of resist activated by the electromagnetic radiation are removed.

Next, recesses are formed in those portions of the substrate not covered by the first layer.

Finally, those portions of the first layer not covered by remaining portions of the resist layer are removed, thereby creating the desired rim structure responsible for the phase shift effects.

Although the recesses in the substrate may be formed toward the end of the method, as described above, as an alternative process sequence, the recesses may be formed immediately after the formation of openings in the first layer. The depth of the recesses is selected based on the wavelength of the electromagnetic radiation to be used in the phase-shift process and the refractive index of the substrate so as to achieve the desired phase shift effects.

Typically, the resist layer is deposited both on the first electromagnetic radiation-blocking layer and on either (1) exposed portions of the surface of the substrate or (2) in the recessed portions formed in the substrate, depending upon when in the process sequence the recesses are formed. The resist layer is exposed to electromagnetic radiation transmitted through the substrate via its second surface for a longer period of time than is required to activate portions of the resist layer deposited on exposed surfaces of the substrate or in the recesses in the substrate, as the case may be. This overexposure results in the activation of portions of the resist layer extending from peripheral edges of the first layer inwardly a distance of at least about 0.05 micron, as discussed above.

BRIEF DESCRIPTION OF THE DRAWINGS

For an understanding of the nature and objects of the present invention, reference should be made to the following detail description taken in connection with the accompanying drawings wherein.

The relative size and thickness of the various structure illustrated in the figures is not necessarily drawn to scale.

DETAILED DESCRIPTION OF THE INVENTION

Figure 4A:
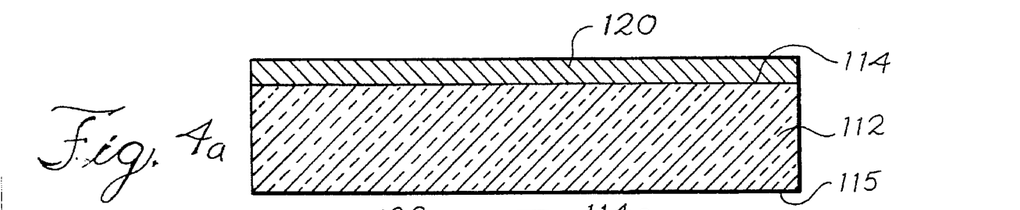
FIG. 4a is a cross sectional view of a phase-shift lithography mask substrate and a light-blocking layer covering the substrate.
Figure 4B:
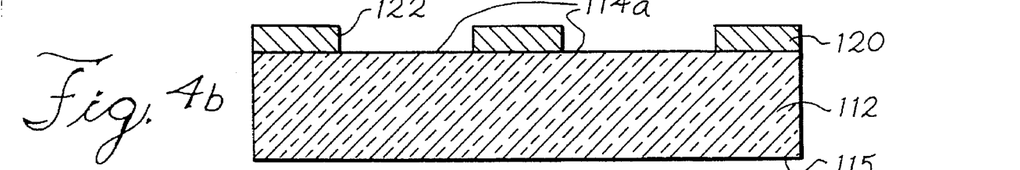
FIG. 4b is similar to FIG. 4a, except that portions of the blocking layer have been removed as one step in the process of the present invention.
Figure 4C:
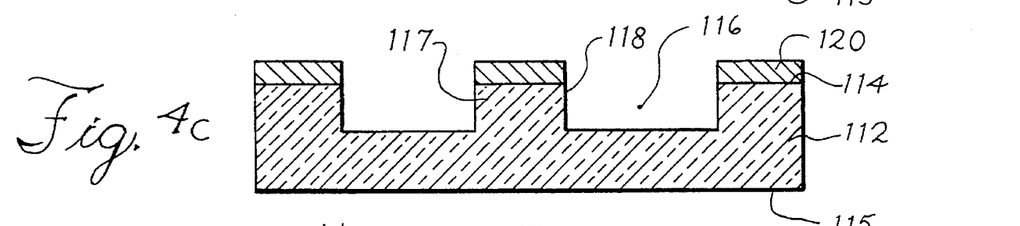
FIG. 4c is similar to FIG. 4b, except that recessed portions have been formed in those portions of the substrate not covered by the blocking layer.
Figure 4D:
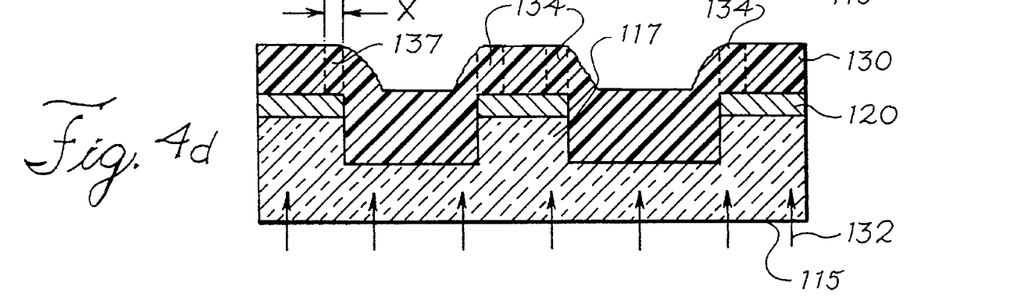
FIG. 4d is similar to FIG. 4c, except that a layer of resist has been applied in the recessed portions of the substrate and on top of the blocking layer, with the arrows representing electromagnetic radiation that is directed toward the back side of the substrate at this stage in the process of the present invention.
Figure 4E:
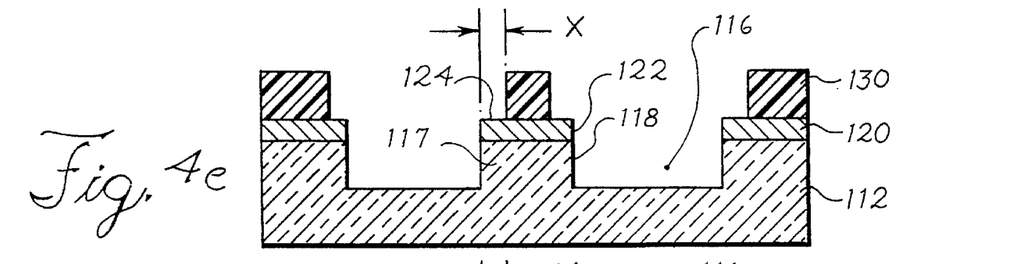
FIG. 4e is similar to FIG. 4d, except that portions of the resist layer activated by the backside exposure have been removed.
Figure 4F:
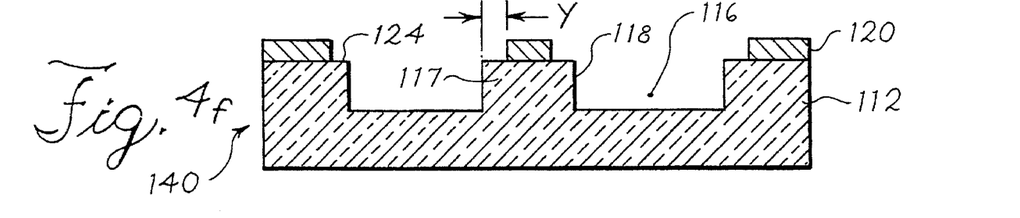
FIG. 4f is similar to FIG. 4e, except that portions of the blocking layer underlying the remaining portions of the resist layer illustrated in FIG. 4e have been removed along with the remaining portions of the resist layer.

Referring to FIGS. 4a–4f, the present invention is a method of forming a rim-type phase-shift lithography mask 140 (FIG. 4f). As the first step in the method, a mask substrate 112 having a top surface 114 and a bottom surface 115 is provided, as illustrated in FIG. 4a. Surfaces 114 and 115 are substantially planar and extend substantially in parallel. Substrate 112 is made from a material that will transmit electromagnetic radiation of the wave length used in phase shift lithography (hereinafter "phase-shift radiation"), i.e., radiation having wave lengths in the range 200–400 nm. Quartz is the preferred material for substrate 12, although other materials having a suitable refractive index and other characteristics may also be used. The thickness of substrate 112 will vary based on known design considerations. However, in one embodiment of the present method, the substrate has a thickness of about 2–7 mm.

Top surface 114 is at least partially covered with a blocking layer made from a material 120 through which phase-shift radiation cannot pass. Suitable materials for blocking layer 120 include chromium, molybdenum, aluminum, tungsten, and titanium. Chromium is the preferred material for layer 120 due to its relatively high resistance to chemicals of the type present in phase-shift lithography processes and because there is a large installed base of sophisticated chromium mask repair tools. The specific thickness of blocking layer 120 will vary as a function of the ability of the material used as the layer to block the transmission of phase-shift radiation. However, when layer 120 is made from chromium, it is preferred that the layer have a thickness ranging from 1 nm to 1,000 nm with a thickness of about 100 nm being preferred.

Next, as illustrated in FIG. 4b, portions of blocking layer 120 are removed using known masking and etching techniques (e.g., reactive ion etching in a chlorine and oxygen ambient) so as to expose top surface portions 114a of substrate 112. The configuration of the pattern formed by the removal of portions of blocking layer 120 corresponds to the configuration of the portions of a resist layer (not shown) to be exposed using a mask fabricated in accordance with the present invention. The specific dimensions of the openings formed by the removal of portions of blocking layer 120 are typically one to five times as large as the dimensions of the corresponding structure to be activated on the resist layer. That is, the remaining portions of blocking layer 120 are not reduced in size at this stage in the process for the purpose of creating the rim structure responsible for the formation of destructive interference patterns in the light transmitted through substrate 112.

As illustrated in FIG. 4c, recessed portions 116 are then formed in substrate 112, with mesas 117 remaining between the recessed portions. Recessed portions 116 are preferably formed using an anisotropic reactive ion etching (RIE) process in a suitable ambient, e.g., a $CHF_3$, $CF_4$ or F ambient. As a result of the anisotropic nature of the RIE etch process, the sidewalls 118 defining the edges of recessed portions 116 are substantially vertical, i.e., the sidewalls extend substantially perpendicularly to top surface 114. In connection with the formation of recessed portions 116, the remaining portions of blocking layer 120 function as a mask. Although the remaining portions of blocking layer 120 may alone provide this masking function, it is preferred that at least a portion, and preferably all, of the surface of such remaining portions of the blocking layer be covered with a layer of resist prior to forming recessed portions 116. As discussed above in connection with FIG. 1, the depth of recessed portions 116 must be precisely controlled to obtain destructive interference of incident phase-shift radiation. Conventional RIE processes are readily controllable to the extent required to obtain recessed portions 116 having the precise depth required to achieve the desired destructive interference effects. The absolute depth of recessed portions will vary as a function of the refractive index of the material used for substrate 112 and the thickness of the substrate. However, in one embodiment of the invention where substrate 112 is made from substantially pure quartz having a refractive index of 1.6, and the phase-shift radiation has a wavelength of 365 nm, recessed portions have a depth of about 385 nm.

To avoid the formation of defects in substrate 112 created during the formation of recessed portions 116, the etching of substrate 112 can be accomplished in multiple etch/wash steps using the known technique of "voting." If desired, the depth of recessed portion 116 may be determined by measuring the thickness of remaining underlying portions of substrate 112 and then performing follow-on RIE processes based on the result of such measurement until recessed portion 116 have achieved the desired depth.

As discussed hereinafter, an alternative process sequence for the present invention involves forming recessed portions 112 after completion of the process step illustrated in FIG. 4e and described hereinafter. Regardless of whether recessed portions 116 are formed immediately after portions of blocking layer 120 are removed, as described above and illustrated in FIGS. 4b and c, or the recessed portions are formed later in the process sequence, as described hereinafter, the next step in the process involves depositing a layer of resist 130 on the remaining portions of blocking layer 120. In addition, resist layer 130 also (a) at least partially fills recessed portions 116, when the latter are formed immediately following the removal of selected portions of blocking layer 120, as illustrated in FIG. 4c or (b) covers exposed top surface portions 114a of substrate 112, if recessed portions 116 are formed later in the process. Resist layer 130 is a conventional positive resist having a relatively high contrast. Such resist material is used widely in the semiconductor industry and need not possess the very high contrast characteristic of resist used in deep UV and other photolithography processes. The conformal nature of resist layer 130 has been exaggerated somewhat in FIG. 4d for purposes of illustration.

As the next step, also illustrated in FIG. 4d, resist layer 130 is exposed to electromagnetic radiation transmitted through substrate 112. This electromagnetic radiation, indicated by arrows 132 in FIG. 4d, is applied as a blanket exposure to bottom surface 115. The electromagnetic radiation propagates through substrate 112 and activates those portions of the resist layer not covering the remaining portions of blocking layer 120. That is, the electromagnetic radiation activates the portions of the resist layer covering surface portions 114a or deposited in recessed portions 116, depending upon when in the process sequence recessed portions 116 are formed. As used herein, resist layer 130 is "activated" when it is exposed to light of sufficient intensity and for a sufficient period of time to change the chemical structure thereof so that exposure to an appropriate developer for a suitable period of time will substantially completely remove such exposed portions of the resist layer while not removing portions that have not been so exposed.

Substrate 112 is exposed to backside electromagnetic radiation 132 for a longer period of time than is required to activate the portions of resist layer 130 on surface portions 114a or in recessed portions 116. The extent of overexposure is carefully controlled so that portions 134 (FIG. 4d) of resist layer 130 are also activated. Portions 134 extend inwardly from vertical projections of peripheral edges 122 of the remaining portions of blocking layer 120 a distance X (FIGS. 4d and 4e) to imaginary substantially vertical planes extending parallel or nearly parallel to the vertical extensions of peripheral edges 122. The interface between activated and unactivated regions of resist layer portions 134 following backside exposure extends substantially vertically, i.e., substantially perpendicularly to the top surface 114 of substrate 112. The specific mechanism responsible for such activation of the resist layer is not entirely understood. However, it is hypothesized that near-field diffraction of the electromagnetic radiation occurs relative to the exposed corners of blocking layer 120, which diffraction causes the electromagnetic radiation to bend around the corner and activate resist layer portions 134 (FIG. 4d).

Referring to FIG. 4e, as the next step in the process, activated portions of resist layer 130 are removed by appropriate developing processes of the type well known in the art. Following such developing, the only portions of resist layer 130 remaining are positioned on top of blocking layer 120. Such remaining portions of resist layer 130 are defined by substantially vertical sidewalls that are pulled back from the peripheral edges 122 of the portion of the blocking layer 120 on which they are located a distance X (see FIG. 4e), as measured along an axis extending parallel to top surface 114.

As discussed above, in some cases it may be desirable to delay the formation of recessed portions 116 until this stage in the process, i.e., until after completion of the process steps illustrated in FIG. 4e. As when recessed portions 116 are formed earlier in the process sequence, the remaining portions of blocking layer 120 mask those portion of substrate 112 where recessed portions 116 are not to be formed. Recessed portions 116 are formed at this stage in the process in the manner described above in connection with the discussion of FIG. 4c. The extent of pull back of the remaining portions of resist layer 130 is not affected by the formation of recessed portions 116, although the height of such resist portions may be reduced to some extent.

Finally, those portions of blocking layer 120 not covered by remaining portions of resist layer 130 are removed, e.g., using a conventional dry anisotropic (directional) process, as illustrated in FIG. 4f. More specifically, such portions of blocking layer 120 are preferably removed using a RIE process that etches primarily in a vertical direction (i.e., perpendicular to top surface 114). Consequently, due to the masking function provided by the remaining portions of resist layer 130, almost none of the blocking layer 120 underlying remaining portions of resist layer 130 is etched away. Thus, the distance Y (FIG. 4f) the remaining portions of blocking layer 120 are pulled back from adjacent sidewalls 118 is equal to the distance X (FIG. 4e) the remaining portions of the resist layer are pulled back from such sidewalls 118. Although a dry anisotropic etching process that removes exposed portions of blocking layer 120 primarily in a vertical direction is preferred, it may be possible to remove such portions using wet or dry isotropic etching processes, if sufficiently controllable to achieve the desired pull back distance Y. Any portions of resist layer 130 remaining after this final etching of blocking layer 120 are removed using known processes. Upon completion of this last step in the process, the desired rim structure responsible for the phase shift phenomenon exists at the peripheral edges of the top surface of mesa 117.

Pull back distance X, and hence the period of overexposure of resist layer 130, is selected to optimize two characteristics of the light pattern created beneath mask 140 when the back side of the mask is exposed to phase-shift radiation. Referring to FIGS. 1 and 4d, the first of these characteristics is the placement of the interface between light and dark regions beneath substrate 112 relative to planar extensions of sidewalls 118. Each such interface, identified by line 30 in FIG. 1, optimally is coplanar with a respective sidewall 118, that is, the interface of light and dark regions preferably extends vertically and is substantially aligned with sidewalls 118. The second characteristic is the radiation intensity beneath mesas 117, i.e., beneath that region of substrate 112 bounded by planar projections of the pair of sidewalls 118 defining a given mesa. Although two slightly higher intensity regions, identified by "bumps" 42 in FIG. 1, will typically exist beneath a given mesa 117, the amplitude of such higher intensity regions can be minimized by controlling the extent of overexposure of backside light 132, and hence optimizing the pull back distance X. To some extent optimization of the first characteristic will result in degradation of the second characteristic and vice versa. Thus, the extent of overexposure of backside phase-shift radiation 132, and hence the size of pull back distance X, will be determined based on a compromise between these first and second characteristics of the light pattern created beneath the mask formed in accordance with the present method.

Formation of the rim structure on rim-type phase-shift masks using the process illustrated in FIGS. 4a–4f and described above (involving overexposure of the resist layer) is inherently more controllable than the prior art process described above and illustrated in FIGS. 3a–3d (involving horizontal etching of the chrome blocking layer). This advantage of the process of the present invention is graphically illustrated in FIG. 5. In this figure, the amount of the blocking layer that is removed with time, and hence the increase in pull back distance Y with time, is illustrated by line 200 for the prior art process described above and illustrated in FIGS. 3a–3d. As indicated by line 200, the amount of the chromium blocking layer removed by the prior art overetching process increases linearly with time until substantially all of the blocking layer is removed.

Figure 5:
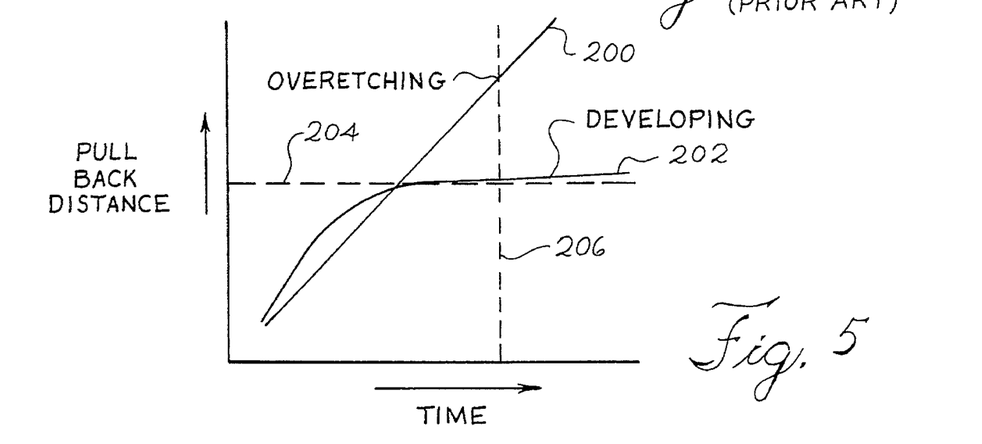
FIG. 5 is a graph illustrating the extent of pull back of the blocking layer that occurs with time for both the process of the present invention and a prior art process.

Curve 202 in FIG. 5 represents the amount of pull back of activated portions 134 of resist layer 130 (i.e., pull back distance X) that occurs with time using the developing process of the present invention. At the beginning of the developing process, activated portions of resist layer 130 are rapidly removed. However, a point is reached in the developing process, after substantially all of the activated portions of the resist layer have been removed, when very little additional removal of the resist layer occurs with time. Assuming the targeted amount of pull back of the resist layer is identified by horizontal dotted line 204, the developing process of the present invention is preferably conducted until the time indicated by the dotted vertical line 206 is reached. By continuing the developing process well into the "flat" part of curve 202, a significant amount of overdeveloping or underdeveloping can be tolerated while still maintaining the desired pull back distance X identified by line 204.

By comparison, because the prior art overetching process illustrated in FIGS. 3a–3d removes the chromium blocking layer at a substantially constant linearly increasing rate, if the overetching process is terminated too soon or is conducted for too long a period of time, the amount of pull back of the blocking layer will vary significantly relative to the targeted pull back distance X represented by horizontal line 204. Such variation in the pull back of the blocking layer of the prior art process illustrated in FIGS. 3a–3d renders the process unsuitable, in manufacturing and other contexts, as a technique for forming rim-type phase-shift lithography masks.

With the present method, pull back distance X of resist layer 130, and hence pull back distance Y of blocking layer 120, typically ranges from about 0.05–0.5 micron, with a pull back distance X of about 0.3 micron being preferred. However, with sufficient overexposure, a pull back distance X of well in excess of 0.5 micron is achievable. Importantly, with the present method, pull back distance X may be controlled to within about ±0.02 micron. A minimum pull back distance X of about 0.05 micron is generally required to create a rim structure on the mask of sufficient size to achieve the desired phase shift effects.

As those of ordinary skill in the art will appreciate, mask 140 includes other structures not illustrated in the figures or described above. For instance, a rim surrounding the periphery of the mask may be provided and a pellicle positioned in spaced relation to the mask may be used.

EXAMPLE

A rim-type phase-shift mask was formed using the process described above and illustrated in FIGS. 4a–4f. The mask was intended for use with deep UV 248 nm wavelength) phase-shift radiation. As the first step in the process, a quartz substrate 112 having a refractive index of 1.62 was provided. The substrate had a thickness of 2.25 mm and its top surface 114 was coated with a layer of chromium 120 having a thickness of about 100 nm. Next, a pattern was formed in the chromium layer by removing selected portions thereof using known masking procedures and an isotropic RIE process in a $CHF_3$ ambient so as to expose top surface portions 114a.

Then, the remaining portions of the chromium layer were coated with a layer of positive resist using known masking and developing processes. Next, recessed portions 116 were formed in substrate 112 using an anisotropic RIE process in a CF ambient such that the sidewalls 118 of the recessed portions 116 were substantially vertical and had a height of about 242 nm.

As the next step, a layer of Novalak positive resist (IBM TNS 4200) was deposited on the remaining portions of chromium layer 120 and in recessed portions 116, as illustrated in FIG. 4d. Then, back surface 115 of substrate 112 was subjected to a blanket exposure of broad band UV (200–400 nm) electromagnetic radiation for about 15 seconds. The electromagnetic radiation from the back side exposure propagated through substrate 112 and entered the portions of the resist layer deposited in recessed portions 116, thereby activating such portions. Continued backside exposure activated those portions of the resist layer extending from peripheral edges of the remaining portions of chromium layer 120 inwardly a distance of about 0.3 micron. Such portions are identified by reference number 134 in FIG. 4d.

Thereafter, activated portions of the resist layer were developed away using a 0.23N KOH developer, leaving residual resist portions on top of chromium layer 120. These residual portions of the resist layer were pulled back about 0.3 micron from peripheral edges of the chromium layer 120. The developing process was conducted for about 200 seconds, a period of time sufficient to enter the "flat" part of developing curve 202 illustrated in FIG. 5 and described above.

As the final step, the remaining portions of the resist layer and exposed portions of the chromium layer were subjected to an anisotropic RIE process in a $Cl_2+O_2$ ambient which removed those portions of the chromium layer not covered by remaining portions of the resist layer. Following this RIE process, the peripheral edges of the remaining portions of the chromium layer had a substantially vertical profile and were pulled back about 0.3 micron from adjacent sidewalls 118.

As described above, the present method typically involves removing portions of resist layer 130 overlying a peripheral portion of blocking layer 120 so as to achieve a pull back distance X in the resist layer. However, when pull back distance X is greater than half the width (i.e., the horizontal dimension, as viewed in FIGS. 4a–4f) of mesa 117, all of the resist layer overlying the mesa will be activated by the backside exposure. Thereafter, etching of exposed portions of the blocking layer will necessarily result in removal of the entire blocking layer. This phenomenon only occurs when the width of the mesa 117 is relatively small, e.g., 0.3–0.8 micron. Typically, such narrow mesa portions are attached to wider mesa portions on which portions of the resist layer remain after the peripheral edges thereof are pulled back distance X.

The present invention, as described above, is a process for forming a rim-type phase-shift mask. However, it is to be appreciated that the rim structure created with the present invention may be used for purposes other than a phase-shift mask. For instance, the present invention may be used to form micro-mechanical structures.

Since certain changes may be made in the above process without departing from the scope of the invention described herein, it is intended that all matter contained in the above description or shown in the accompanying drawings shall be interpreted in an illustrative and not in a limiting sense.

What is claimed is:

1. A method of forming a rim-type phase-shift mask designed for use in a phase-shift lithography process, the method comprising the steps of:

(a) providing a substrate having opposing first and second surfaces, said substrate being made from a material through which electromagnetic radiation of a predetermined frequency range may be transmitted, said first surface being at least partially covered with a first layer of material that substantially blocks the transmission therethrough of electromagnetic radiation of said predetermined frequency range;

(b) forming a plurality of openings extending through said first layer so as to expose underlying portions of said substrate;

(c) depositing a layer of resist on said first layer; and (d) exposing said second surface of said substrate to electromagnetic radiation having a frequency range in said predetermined frequency range for a period of time sufficient to permit said electromagnetic radiation to propagate through said substrate and activate those portions of said layer of resist on said first layer extending from peripheral edges of said first layer inwardly a distance of at least about 0.05 micron, as measured along an axis extending parallel to said first surface of said substrate.

2. A method according to claim 1, further comprising the step, following said step (d), of:

(e) removing those portions of said layer of resist activated by said electromagnetic radiation.

3. A method according to claim 2, further comprising the step, following said step (e), of:

(f) removing those portions of said first layer not covered by said layer of resist remaining after said step (e) is completed.

4. A method according to claim 3, further comprising the step, after said step (e) and before said step (f), of forming recesses of selected configuration and depth in those portions of said substrate not covered by said first layer.

5. A method according to claim 4, wherein said forming step is performed so that sidewalls in said substrate defining said recesses extend substantially perpendicular to said first surface of said substrate.

6. A method according to claim 4, wherein said depth of said recesses is selected as a function of the refractive index of said substrate and the wavelength of electromagnetic radiation to be used in the phase-shift lithography process.

7. A method according to claim 1, further comprising the step, after said step (b) and before said step (c), of forming recesses of selected configuration and depth in those portions of said substrate not covered by said first layer.

8. A method according to claim 1, wherein said resist deposited in said step (c) is a positive resist.

9. A method of forming a rim-type phase-shift mask designed for use in a phase-shift lithography process, the method comprising the steps of:

(a) providing a substrate having opposing first and second surfaces, said substrate being made from a material through which electromagnetic radiation of a predetermined frequency range may be transmitted, said first surface being at least partially covered with a first layer of material that substantially blocks the transmission therethrough of electromagnetic radiation of said predetermined frequency range;

(b) forming a plurality of openings in said first layer so as to expose portions of said substrate;

(c) depositing a layer of resist on said first layer and on portions of said substrate exposed through said openings in said first layer;

(d) transmitting electromagnetic radiation having a frequency range in said predetermined frequency range through said substrate via its second surface for a selected period of time so as to cause said electromagnetic radiation to activate portions of said resist layer, wherein said selected period of time is longer than is required to activate those portions of said layer of resist not covering said first layer;

(e) developing said layer of resist for at least a period of time sufficient to remove portions of said layer of resist activated by said electromagnetic radiation; and (f) removing those portions of said first layer not covered by said layer of resist remaining after said step (e) is completed using an anisotropic etching process.

10. A method according to claim 9, wherein said anisotropic etching process is a reactive ion etching process designed to remove said first layer primarily in a direction extending perpendicular to said first surface of said substrate.

11. A method according to claim 9, wherein said step (e) involves developing said layer of resist for more than the minimum period of time necessary to remove portions of said layer of resist activated by said electromagnetic radiation.

12. A method of forming a self-aligned rim structure on a substrate, the method comprising the steps of:

(a) providing a substrate having opposing first and second surfaces, said substrate being made from a material through which electromagnetic radiation of a predetermined frequency range may be transmitted, said first surface being at least partially covered with a first layer of material that substantially blocks the transmission therethrough of electromagnetic radiation of said predetermined frequency range;

(b) forming a plurality of openings extending through said first layer so as to expose underlying portions of said substrate;

(c) depositing a layer of resist on said first layer and on portions of said substrate exposed through said openings in said first layer; and (d) removing those portions of said layer of resist (i) on said portions of said substrate exposed through said openings in said first layer and (ii) on said first layer extending from peripheral edges of said first layer inwardly a distance of at least about 0.05 micron, as measured along an axis extending parallel to said first surface of said substrate.

13. A method according to claim 12, further comprising, after said step (d), the step of:

(e) removing peripheral portions of said first layer not covered by remaining portions of said layer of resist.

14. A method according to claim 13, wherein said step (e) involves removing said peripheral portions using an anisotropic etching process.

15. A method according to claim 12, wherein said step (d) comprises the steps of:

(1) exposing said second surface of said substrate to electromagnetic radiation of said predetermined frequency range for a period of time sufficient to permit said electromagnetic radiation to propagate through said substrate and activate (a) portions of said resist layer covering said portions of said substrate exposed through said openings in said first layer and (b) portions of said resist layer extending from peripheral edges of said first layer inwardly a distance of at least about 0.05 micron, as measured along an axis extending parallel to said first surface of said substrate; and (2) developing said activated portions of said resist layer for at least a period of time sufficient to remove said activated portions.

16. A method according to claim 12, further comprising, after said step (d), the steps of:

(e) forming a plurality of recesses in said substrate, each of which communicates with a respective one of said plurality of openings in said first layer; and (f) removing peripheral portions of said first layer not covered by remaining portions of said layer of resist.

\* \* \* \* \*